United States Patent
Amano et al.

(10) Patent No.: US 6,776,699 B2
(45) Date of Patent: Aug. 17, 2004

(54) ABRASIVE PAD FOR CMP

(75) Inventors: Takashi Amano, Kanagawa (JP); Toshihiko Watase, Tokyo (JP); Kengo Imamura, Kanagawa (JP)

(73) Assignee: 3M Innovative Properties Company, St. Paul, MN (US)

( * ) Notice: Subject to any disclaimer, the term of this patent is extended or adjusted under 35 U.S.C. 154(b) by 49 days.

(21) Appl. No.: 10/313,000

(22) PCT Filed: Aug. 9, 2001

(86) PCT No.: PCT/US01/25006
§ 371 (c)(1),
(2), (4) Date: Jan. 2, 2003

(87) PCT Pub. No.: WO02/14018
PCT Pub. Date: Feb. 21, 2002

(65) Prior Publication Data
US 2004/0003895 A1 Jan. 8, 2004

(51) Int. Cl.[7] .................................. B24D 11/00
(52) U.S. Cl. ........................ 451/527; 451/530
(58) Field of Search ............... 451/28, 526, 527, 451/528, 530, 533; 51/295, 307

(56) References Cited

U.S. PATENT DOCUMENTS

| | | |
|---|---|---|
| 4,735,632 A | 4/1988 | Oxman et al. |
| 5,014,468 A | 5/1991 | Ravipati et al. |
| 5,152,917 A * | 10/1992 | Pieper et al. .................. 51/295 |
| 5,549,961 A * | 8/1996 | Haas et al. .................. 428/143 |
| 5,672,554 A * | 9/1997 | Mohri et al. ................. 501/127 |
| 5,707,409 A * | 1/1998 | Martin et al. .................. 51/295 |
| 5,958,794 A | 9/1999 | Bruxvoort et al. |
| 6,121,143 A | 9/2000 | Messner et al. |
| 6,165,437 A | 12/2000 | Mohri et al. |

FOREIGN PATENT DOCUMENTS

| | | |
|---|---|---|
| EP | 0 447 885 | 11/1994 |
| JP | 06-191836 | 7/1994 |
| WO | WO 95/07797 | 3/1995 |
| WO | WO 95/22436 | 8/1995 |
| WO | WO 97/11484 | 3/1997 |

OTHER PUBLICATIONS

Mohri et al., "Development of Advanced Alumina", Functional Materials, Dec. 1996, vol. 16, No. 12, pp. 18–27.

* cited by examiner

*Primary Examiner*—Dung Van Nguyen

(57) ABSTRACT

An abrasive pad for CMP has a substrate and an abrasive layer disposed on the substrate. An abrasive pad for CMP having a substrate and an abrasive layer disposed on the substrate, wherein said abrasive layer has a three-dimensional structure including a plurality of regularly arranged three-dimensional elements having a predetermined shape, and said abrasive layer comprises an abrasive composite containing advanced alumina abrasive grains produced by a CVD method and a binder as construction components.

5 Claims, 5 Drawing Sheets

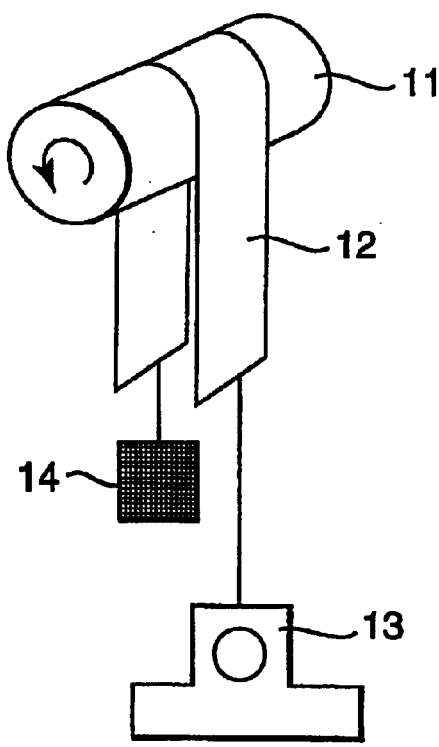
FIG. 11
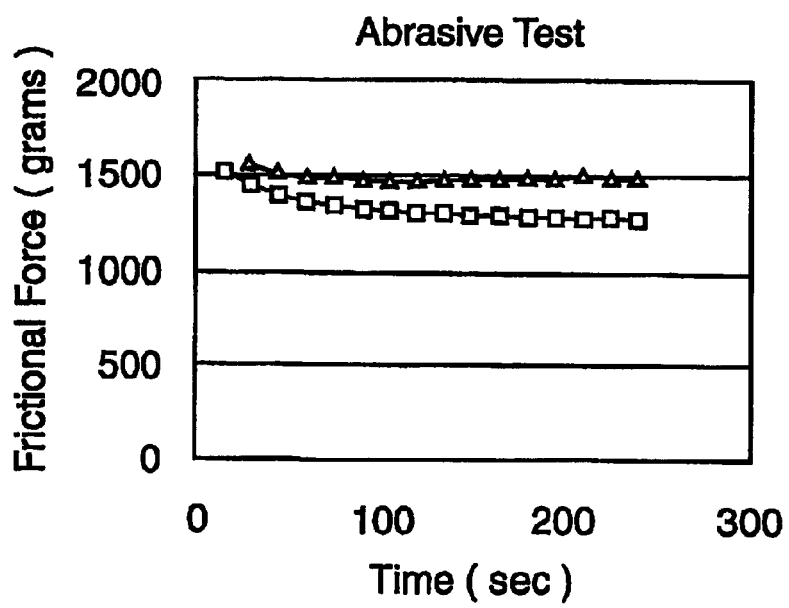
FIG. 12  —△— Comp. Exam.
—□— Exam.

ABRASIVE PAD FOR CMP

TECHNICAL FIELD OF THE INVENTION

The present invention relates to an abrasive pad whose abrasive layer has a three-dimensional structure, and more particularly to an abrasive pad whose abrasive layer has a three-dimensional structure which is used for planarizing a semiconductor wafer by a CMP (chemical and mechanical polishing) process.

BACKGROUND OF THE INVENTION

The CMP process is publicly known as a standard process for planarizing a semiconductor wafer in accordance with high integration of devices and multi-layered wiring. A basic structure of a CMP system includes two units, one for processing and the other for cleaning. The processing unit generally includes a head part for giving rotation and pressurization while maintaining a semiconductor wafer, a driving mechanism thereof, a platen to which a pad is attached to face the semiconductor, and a driving mechanism thereof as a basic structure. In addition, the processing unit includes a mechanism for conditioning (dressing) an abrasive pad, a mechanism for cleaning a wafer chuck surface, a mechanism for supplying a working fluid, and others.

Since the structure and characteristics of the abrasive pad give a great influence on the abrasion characteristics brought about by processing, a further improvement thereof is desired as a key technique for supporting the CMP process. The structure of the abrasive pad has a microscopic aspect and a macroscopic aspect, both of which give an influence on the abrasion characteristics. The microscopic structure represents the types of the abrasive grains and the binder, the foamed state, the surface conditions, and others, while the macroscopic structure represents the surface shapes such as holes, grooves, and projections.

Japanese Patent Kohyo Publication Hei 11-512874 discloses an abrasive pad for a semiconductor wafer, the abrasive layer of which has a regular three-dimensional structure. This abrasive pad can be used in the CMP process. Use of an abrasive layer having a three-dimensional structure restrains the problem of "loading", so that this abrasive pad provides stable abrasion and is excellent in durability.

However, an abrasive pad whose abrasive layer has a three-dimensional structure has a property that the performance of the abrasive grains is liable to give an influence on the abrasion characteristics. This raises a problem that it is difficult to sufficiently modify the finish of the abraded surface by the use of a general-purpose α-alumina abrasive grains. Particularly in the CMP process, it is requested that the semiconductor wafer surface has a surface roughness of 1 to 2 nm Ry (maximum hight, JIS B 0601), and is free from OSF (oxidation-induced stacking fault), free from microscratches, and free from haze while ensuring a high degree of flatness.

However, if α-alumina abrasive grains obtained by a conventional general production method are used in an abrasive material formed to have a three-dimensional structure, the frictional force at the time of abrasion is high, so that defects or scratches are liable to be generated on the abraded surface. On the other hand, use of expensive abrasive grains such as diamond increases the production cost of the abrasive pad.

The present invention has been made to solve the aforesaid problems of the prior art and an object thereof is to provide an abrasive pad for CMP having good friction properties and being inexpensive and excellent in durability without causing defects or scratches on the abraded surface of a semiconductor wafer.

SUMMARY OF THE INVENTION

The present invention provides an abrasive pad for CMP having a substrate and an abrasive layer disposed on the substrate, wherein said abrasive layer has a three-dimensional structure including a plurality of regularly arranged three-dimensional elements having a predetermined shape, and said abrasive layer comprises an abrasive composite containing advanced alumina abrasive grains produced by a CVD method and a binder as construction components, thereby aforesaid object of the present invention is achieved.

BRIEF DESCRIPTION OF THE DRAWINGS

FIG. 11 is a model view illustrating a method of testing the frictional force of an abrasive pad.

FIG. 12 is a plotted graph showing how the frictional force generated in an abrasion step changes with lapse of time.

PREFERRED EMBODIMENT

Figure 1:
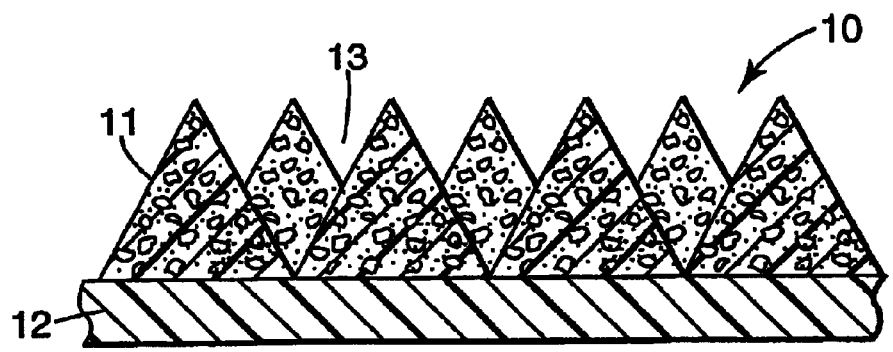
FIG. 1 is a sectional view showing an example of abrasive layer structure of the present invention.

Typical example of an abrasive layer is exemplified as FIGS. 1, 2, 3, and 4.

Preferred abrasive layer may be precisely shaped (as defined in the description) or irregularly shaped, with precisely shaped elements being preferred.

The individual three-dimensional element shape may have the form of any of a variety of geometric solids. Typically the base of the shape in contact with the substrate has a larger surface area than the distal end of the composite. The shape of the element may be selected from among a number of geometric solids such as a cubic, cylindrical, prismatic, truncated prismatic, stripe, rectangular, pyramidal, truncated pyramidal, tetrahedral, truncated tetrahedral, conical, truncated conical, hemispherical, truncated hemispherical, cross, or post-like cross sections with a distal end.

Element pyramids may have four sides, five sides or six sides. The three-dimensional elements may also have a mixture of different shapes. The three-dimensional elements may be arranged in rows, in spirals, in helices, or in lattice fashion, or may be randomly placed.

The sides forming the three-dimensional elements may be perpendicular relative to the substrate, tilted relative to the substrate or tapered with diminishing width toward the distal end. If the sides are tapered, it is easier to remove the three-dimensional element from the cavities of a mold or production tool. The tapered angle may range from about 1 to 75 degrees, preferably from about 2 to 50 degrees, more preferably from about 3 to 35 degrees and most preferably between about 5 to 15 degrees.

The smaller angles are preferred because this results in a consistent nominal contact area as the composite wears. Thus, in general, the taper angle is a compromise between an angle large enough to facilitate removal of the three-dimensional element from a mold or production tool and small enough to create a uniform cross sectional area. An three-dimensional element with a cross section that is larger at the distal end than at the back may also be used, although fabrication may require a method other than simple molding.

The height of each three-dimensional element is preferably the same, but it is possible to have elements of varying heights in a single abrasive article. The height of the three-dimensional elements with respect to the substrate generally may be less than about 2,000 micrometers, and more particularly in the range of about 25 to 200 micrometers.

The base of the three-dimensional elements may abut one another or alternatively, the bases of adjacent three-dimensional elements may be separated from one another by some specified distance. In some embodiments, the physical contact between adjacent three-dimensional elements involves no more than 33% of the vertical height dimension of each contacting elements. More preferably, the amount of physical contact between the abutting elements is in the range of 1 to 25% of the vertical height of each contacting elements.

This definition of abutting also covers an arrangement where adjacent elements share a common three-dimensional element land or bridge-like structure which contacts and extends between facing sidewalls of the elements. Preferably, the land structure has a height of no greater than 33% of the vertical height dimension of each adjacent element. The three-dimensional element land is formed from the same slurry used to form the three-dimensional elements. The elements are adjacent in the sense that no intervening composite is located on a direct Imaginary line drawn between the centers of the elements. It is preferred that at least portions of the three-dimensional elements be separated from one another so as to provide the recessed areas between the raised portions of the elements.

The linear spacing of the three-dimensional elements may range from about 1 three-dimensional element per linear cm to about 100 three-dimensional elements per linear cm. The linear spacing may be varied such that the concentration of elements is greater in one location than in another. For example, the concentration may be greatest in the center of the abrasive article. The areal density of elements ranges from about 1 to 10,000 elements/cm$^2$.

It is also feasible to have areas of the substrate exposed, i.e., where the abrasive coating does not cover the entire surface area of the substrate. This type of arrangement is further described in U.S. Pat. No. 5,014,468 (Ravipati et al.).

The three-dimensional elements are preferably set out on a substrate in a predetermined pattern or set out on a substrate at a predetermined location. For example, in the abrasive article made by providing slurry between the substrate and a production tool having cavities therein, the predetermined pattern of the elements will correspond to the pattern of the cavities on the production tool. The pattern is thus reproducible from article to article.

In one embodiment of the predetermined pattern, the three-dimensional elements are in an array or arrangement, by which is meant that the elements are in a regular array such as aligned rows and columns, or alternating offset rows and columns. If desired, one row of three-dimensional elements may be directly aligned in front of a second row of three-dimensional elements. Preferably, one row of abrasive elements may be offset from a second row of three-dimensional elements.

In another embodiment, the three-dimensional elements may be set out in a "random" array or pattern. By this it is meant that the elements are not in a regular array of rows and columns as described above. For example, the abrasive elements may be set out in a manner as described in WO PCT 95/07797 published Mar. 23, 1995 (Hoopman et al.) and WO PCT 95/22436 published Aug. 24, 1995 (Hoopman et al.). It is understood, however, that this "random" array is a predetermined pattern in that the location of the elements on the abrasive article is predetermined and corresponds to the location of the cavities in the production tool used to make the abrasive article.

The three-dimensional, textured, abrasive article also may have a variable abrasive coating composition. For example, the center of an abrasive disc may contain an abrasive coating that is different (e.g., softer, harder, or more or less erodible) from the outer region of the abrasive disc.

The abrasive article 10 in FIG. 1 has pyramidal three-dimensional elements 11 fixed or bonded to substrate 12. There are recesses or valleys 13 between adjacent three-dimensional elements. There is also a second row of pyramidal three-dimensional elements offset from the first row. Outermost point or distal end of the pyramidal abrasive elements contacts the wafer surface during processing.

Figure 2:
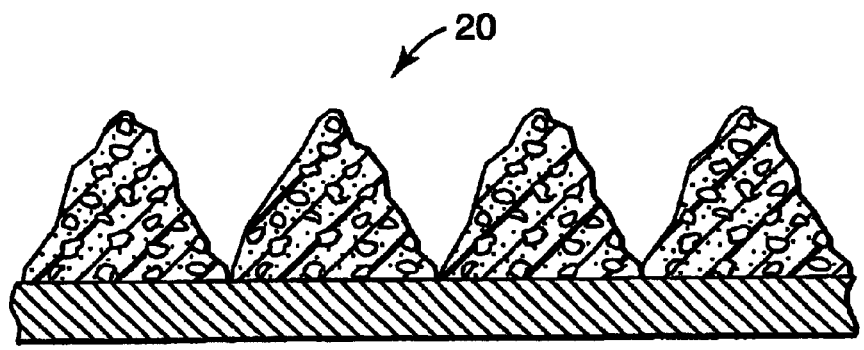
FIG. 2 is a sectional view showing an example of abrasive layer structure of the present invention.

The abrasive article 20 in FIG. 2 has irregular shape, pyramidal abrasive elements. In this particular illustration, the three-dimensional element has a pyramidal type shape. Boundaries which define the pyramid are irregularly shaped. The imperfect shape can be the result of the slurry flowing and distorting the initial shape prior to significant curing or solidification of the binder precursor. An irregular shape is characterized by non-straight, non-clear, non-reproducible, inexact or imperfect planes or shape boundaries.

Figure 3:
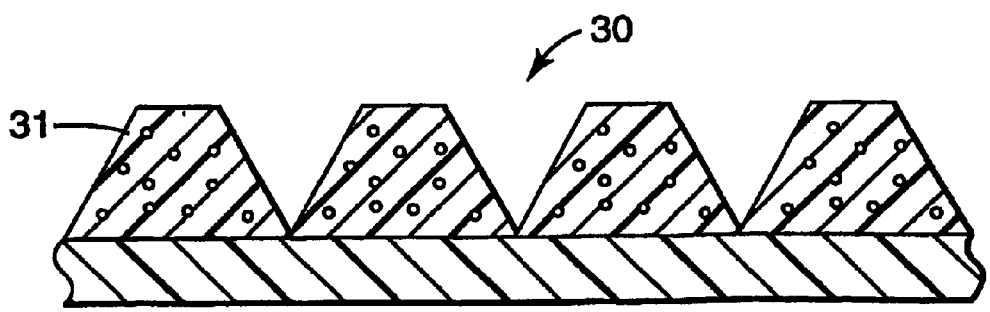
FIG. 3 is a sectional view showing an example of abrasive layer structure of the present invention.

The abrasive article 30 in FIG. 3 has truncated pyramid abrasive elements 31.

Figure 4:
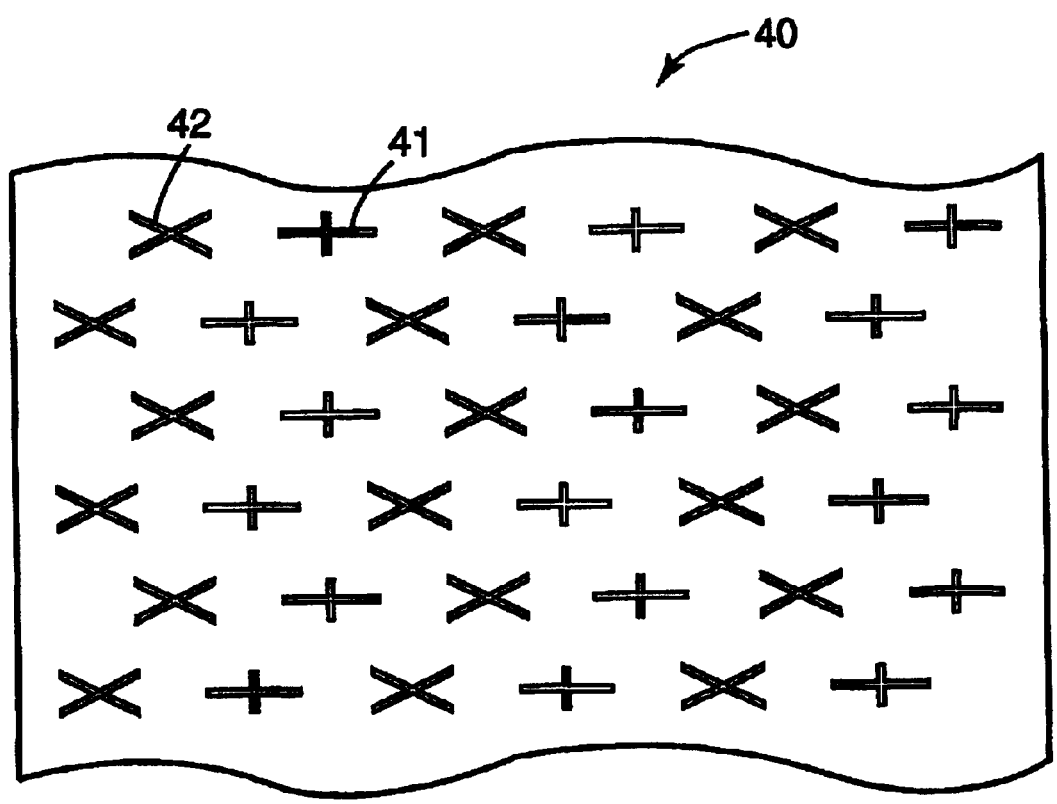
FIG. 4 is a plain view showing an example of abrasive layer of the present invention.

The abrasive article 40 in FIG. 4 has both "cross" shape 41 and an "x" shape 42 three-dimensional elements. The three-dimensional elements are set out in a pattern of rows. The three-dimensional elements in various rows are offset from one another and do not directly align with the three-dimensional elements in an adjacent row. Further, the rows of three-dimensional elements are separated by space or valley. The valley or space may contain only a very small amount (as measured by height) of abrasive composite or may contain no three-dimensional element.

Another arrangement or configuration of three-dimensional elements is similar to FIG. 3, except that each alternating row comprises either three-dimensional elements having the "cross" shape or three-dimensional elements having the "x" shape. In this arrangement, the abrasive elements from the odd rows are still offset from the three-dimensional elements from the even rows. In the above described arrangements of cross-shaped or "x"-shaped elements, it is preferred that the length of one line forming either the cross or the x shape is about 750 micrometers and the width of one line forming either the cross or the x shape is about 50 micrometers.

Figure 5:
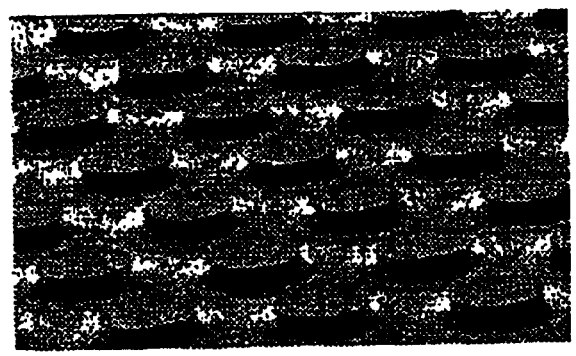
FIG. 5 is an enlarged photograph of an abrading surface of an abrasive pad for CMP as one example of the present invention.

FIG. 5 is a perspective view of an abrading surface of an abrasive pad for CMP as one example of the present invention. It depicts a three-dimensional structure of the abrasive layer. The three-dimensional structure of the abrasive layer is constructed to include a plurality of three-dimensional elements. The shape of the three-dimensional elements is cylindrical, and a plurality of cylindrical shapes are regularly arranged.

Figure 6:
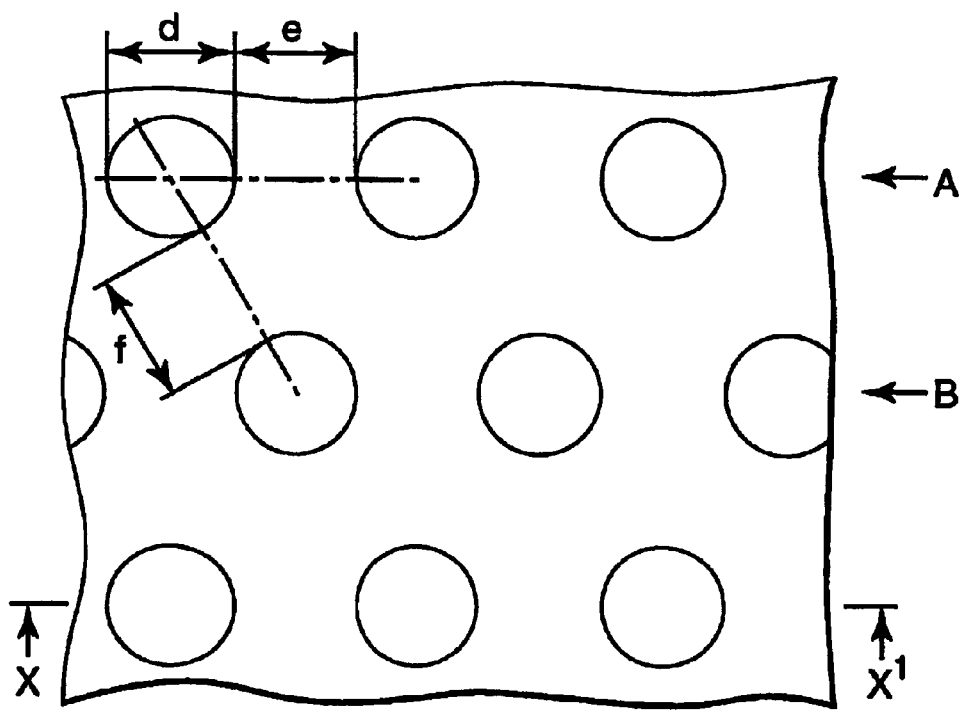
FIG. 6 is a plane view of an abrading surface of an abrasive pad for CMP as one example of the present invention.

FIG. 6 is a plane view of an abrading surface of the abovementioned abrasive pad for CMP. It illustrates one example of a configuration mode of the three-dimensional elements. A plurality of three-dimensional elements are arranged in a lateral direction with equal spacing to form rows A, B . . . and these rows are arranged in a longitudinal direction with a shift so that the three-dimensional elements are alternately arranged.

In FIG. 6, the symbol d represents the diameter of a cylinder which is a three-dimensional element. The value d is, for example, 10 to 5000 $\mu$m, preferably 50 to 500 $\mu$m, more preferably 100 to 300 $\mu$m. The symbol e represents the distance between adjacent three-dimensional elements in the same row. The symbol f represents the distance between adjacent three-dimensional elements in adjacent rows. The values e and f may be the same dimension or different dimensions, and may be for example 10 to 10000 $\mu$m, preferably 50 to 1000 $\mu$m, more preferably 100 to 300 $\mu$m. Generally, the values e and f are the same dimension.

Figure 7:
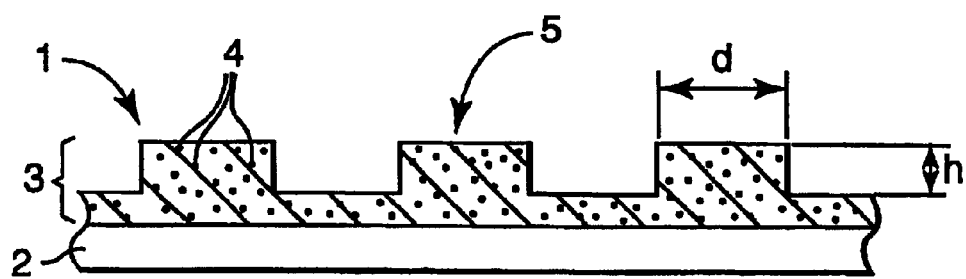
FIG. 7 is a cross section view of an abrasive pad for CMP as one example of the present invention.

FIG. 7 is a cross section view showing the abrasive pad for CMP shown in FIG. 6, which is cut along the XX' surface. In FIG. 7, the abrasive pad 1 has a substrate 2 and an abrasive layer 3 disposed on a surface of the substrate 2. The abrasive layer 3 has a three-dimensional structure.

It is required that the substrate 2 has a uniform thickness. If the thickness of the substrate 2 is not sufficiently uniform, variations in the abraded surface of the semiconductor wafer and the wafer thickness may possibly occur. Any of the various substrates including flexible substrates and comparatively strong substrates is suitable for the purpose of the present invention.

Preferable materials for the substrate include polymer film, paper, cloth, metal film, vulcanized fiber, nonwoven substrate, a combination of these, and processed products of these. One preferable type of the substrate is a polymer film. Examples of such a film include polyester, copolyester film, microgap polyester film, polyimide film, polyamide film, polyvinyl alcohol film, polypropylene film, polyethylene film, and others. The thickness of the polymer film substrate is typically within a range of about 20 to 1000 $\mu$m, preferably 50 to 500 $\mu$m, more preferably 60 to 200 $\mu$m. For example, the substrate may be a polyethylene terephthalate (PET) film.

The bonding property between the polymer film substrate and the abrasive coating must be good. In a number of cases, the bonding property is improved by undercoating the coating surface of the polymer film substrate. For example, the polymer film may be undercoated with a material such as polyethylene acrylic acid in order to promote bonding to the substrate of the abrasive composite.

The abrasive layer 3 is made of an abrasive composite containing a matrix of a binder and abrasive grains 4 dispersed therein.

The abrasive composite is formed from slurry containing a plurality of abrasive grains dispersed in the binder which is in an unhardened or ungelated state. In hardening or gelation, the abrasive composite is solidified, i.e. is fixed to have a predetermined shape and a predetermined structure.

The type of abrasive grains suitable for the present invention is ($\alpha$-alumina particles. The $\alpha$-alumina particles are a general-purpose oxide material used for a variety of uses from aluminum material smelting to fine ceramics materials.

Hitherto, industrial $\alpha$-alumina particles were produced by Bayer method, a method of thermally decomposing fine aluminum hydroxide or alum, or the electromelting method. In these methods, an alumina material is baked or melted at a high temperature to form an alumina block, which is thereafter ground, refined, and sieved to adjust the particle size. For this reason, such $\alpha$-particles are polycrystals having a nonuniform shape, contain a lot of aggregated particles, and have a wide particle size distribution. Further, there are problems such as low purity of alumina depending on the intended usage.

The $\alpha$-alumina particles to be used in the present invention are preferably advanced alumina abrasive grains. The advanced alumina particles refer to $\alpha$-alumina particles produced by the in-situ chemical vapor deposition method (hereafter referred to as CVD method). The advanced alumina particles are excellent in the particle size distribution and in the uniformity of the crystal system of alumina particles as compared with the above-mentioned ones produced by baking and grinding.

The advanced alumina abrasive grains are homogeneous single-crystal particles constructed from particles of grown crystals, and have an approximately spherical property. Further, since the growth size of the crystals can be controlled, the particle size distribution will be sharp. The characteristics and the usage of the advanced alumina abrasive grains are described in "Development of Advanced Alumina", Functional Materials, by Masahide Mohri, Shinichiro Tanaka, and Yoshio Uchida, December issue, 1996, Vol. 16, No. 12, pp. 18–27.

Especially preferable advanced alumina abrasive grains for use in the present invention are described in Japanese Patent Kokai Publication Hei 06-191836. Namely, they are powdery $\alpha$-alumina composed of $\alpha$-alumina single-crystal particles which are homogeneous and free from internal crystal seeds, and which have a polyhedral shape of more than eight surfaces, and a D/H ratio of not less than 0.5 and not more than 3.0 where D is the maximum particle size parallel to the hexagonal lattice surface of $\alpha$-alumina which is a hexagonal closest packing lattice, and H is the particle size vertical to the hexagonal lattice surface, and having a sodium content of less than 0.05 wt % as converted in terms of $Na_2O$, and an aluminum purity of not less than 99.90 wt %.

The dimension of the abrasive grains changes depending on the type of the semiconductor wafer to be abraded and the required finish of the abraded surface. For example, the average particle size thereof is typically 0.1 to 50 $\mu$m, preferably 0.3 to 5 $\mu$m, more preferably 0.4 to 2 $\mu$m. Such advanced alumina abrasive grains are commercially available under the trade name of "Sumicorundum" by Sumitomo Chemical Industry Co., Ltd.

If advanced alumina particles are used as abrasive grains of an abrasive pad for CMP whose abrasive layer has a three-dimensional structure, the frictional force at the time of abrasion in the CMP process will be low to provide stable abrasion, so that defects and scratches are less likely to appear on the abraded surface.

The binder is hardened or gelated to form an abrasive layer. Preferable examples of the binder for the present invention include phenolic resin, resol-phenolic resin, aminoplast resin, urethane resin, epoxy resin, acrylic resin, polyester resin, vinyl resin, melamine resin, acrylated isocyanurate resin, urea-formaldehyde resin, isocyanurate resin, acrylated urethane resin, acrylated epoxy resin, and a mixture thereof. The binder may be a thermoplastic resin.

An especially preferable binder is a radiation-curing binder. The radiation-curing binder is a binder that is at least partially hardened or is at least partially polymerizable by radiation energy. Depending on the binder to be used, an energy source such as heat, infrared radiation, electron beam radiation, ultraviolet radiation, or a visible light radiation is used.

Typically, these binders are polymerized by a free radical mechanism. Preferably, these binders are selected from the group consisting of ethylenic unsaturated compounds such as ethylenic unsaturated monomers and oligomers, acrylated urethane, acrylated epoxy, an aminoplast derivative having an $\alpha,\beta$-unsaturated carbonyl group, an isocyanurate derivative having at least one ethylenic unsaturated group, isocyanate having at least one ethylenic unsaturated group, and a mixture thereof.

The ethylenic unsaturated compound may be monofunctional, bifunctional, trifunctional, tetraranctional, or further polyfunctional, and may include both an acrylic monomer and a methacrylic monomer together. The ethylenic unsaturated compounds include both monomer compounds and polymer compounds containing a carbon atom, a hydrogen atom, an oxygen atom, and optionally a nitrogen atom and a halogen atom depending on the cases.

The oxygen atom, or the nitrogen atom, or both are generally contained in an ether group, an ester group, a urethane group, an amido group, and a urea group. Suitable ethylenic unsaturated compounds are esters produced by reaction of a compound preferably having a molecular weight smaller than about 4000 and preferably having an aliphatic monohydroxy group or an aliphatic polyhydroxy group, with an unsaturated carboxylic acid such as acrylic acid, methacrylic acid, itaconic acid, crotonic acid, isocrotonic acid, or maleic acid.

Representative examples of the ethylenic unsaturated monomers include ethyl methacrylate, styrenedivinylbenzene, hydroxyethyl acrylate, hydroxyethyl methacrylate, hydroxypropyl acrylate, hydroxypropyl methacrylate, hydroxybutyl acrylate, hydroxybutyl methacrylate, vinyltoluene, ethylene glycol diacrylate, polyethylene glycol diacrylate, ethylene glycol dimethacrylate, hexanediol diacrylate, triethylene glycol diacrylate, trimethylolpropane triacrylate, glycerol triacrylate, pentaerythritol triacrylate, pentaerythritol trimethacrylate, pentaerythritol tetraacrylate, and pentaerythritol tetramethacrylate.

Other ethylenic unsaturated materials include monoallyl, polyallyl, and polymetaallyl esters and carboxylic acid amides such as diallyl phthalate, diallyl adipate, and N,N'-diallyladipamide. Further, other nitrogen-containing compounds include tris(2-acryl-oxyethyl)isocyanurate, 1,3,5-tri (2-methacryloxyethyl)-s-triazine, acrylamide, methacrylamide, N-methyl-acrylamide, N,N'-dimethylacrylamide, N-vinyl-pyrrolidone, and N-vinyl-piperidone.

Examples of suitable monofunctional acrylates and methacrylates that can be used in combination with bifunctional or trifunctional acrylate and methacrylate monomers or together with phenolic resin or epoxy resin include lauryl acrylate, octyl acrylate, 2-(2-ethoxyethoxy)ethyl acrylate, tetrahydrofurfuryl methacrylate, cyclohexyl acrylate, stearyl acrylate, 2-phenoxyethyl acrylate, isooctyl acrylate, isobornyl acrylate, isodecyl acrylate, polyethylene glycol monoacrylate, and polypropylene glycol monoacrylate.

If the binder is hardened by ultraviolet radiation, a photoinitiator is required to start free radical polymerization. Preferable examples of the photoinitiator to be used for this purpose include organic peroxides, azo compounds, quinones, benzophenones, nitroso compounds, acryl halides, hydrazones, mercapto compounds, pyrylium compounds, triacrylimidazole, bisimidazole, chloroallyltriazine, benzoin ether, benzyl ketal, thioxanthone, and acetophenone derivatives. A preferable photoinitiator is 2,2-dimethoxy-1,2-diphenyl-1-ethanone.

If the binder is hardened by visible light radiation, it is necessary that a photoinitiator starts a free radical polymerization. Preferable examples of the photoinitiator for this purpose are disclosed in U.S. Pat. No. 4,735,632, column 3, line 25 to column 4, line 10, column 5, lines 1 to 7, and column 6 lines 1 to 35, which are incorporated herein by reference.

The concentration of the abrasive grains contained in the abrasive composite is typically 10 to 90 wt %, preferably 40 to 80 wt %, more preferably 60 to 75 wt %. This ratio changes depending on the size of the abrasive grains, the type of the binder to be used, the required finish of the abraded surface, and others.

The abrasive composite may contain a material other than the abrasive grains and the binder. For example, the abrasive material may contain ordinary additives such as a coupling agent, a lubricant, a dye, a pigment, a plasticizer, a filler, a stripping agent, an is abrasive aid, and a mixture thereof.

The abrasive composite can contain a coupling agent. Addition of the coupling agent can considerably reduce the covering viscosity of a slurry to be used for formation of the abrasive composite. Preferable examples of the coupling agent for the present invention include organic silane, zircoaluminate, and titanate. The amount of the coupling agent is typically less than 5 wt %, preferably less than 1 wt %, of the binder.

The abrasive layer 3 has a three-dimensional structure including a plurality of regularly arranged three-dimensional elements 5 having a predetermined shape. These three-dimensional elements 5 are cylindrical. The height h of the cylinder is typically 10 to 500 $\mu$m, preferably 20 to 200 $\mu$m, more preferably 30 to 65 $\mu$m.

The abrasive grains 4 do not protrude beyond the surface of the shape of the three-dimensional elements. In other words, the three-dimensional elements 5 are constructed with flat planes. For example, the surfaces constituting the three-dimensional elements 5 have a surface roughness Ry of not more than 2 $\mu$m, preferably not more than 1 $\mu$m.

Figure 8:
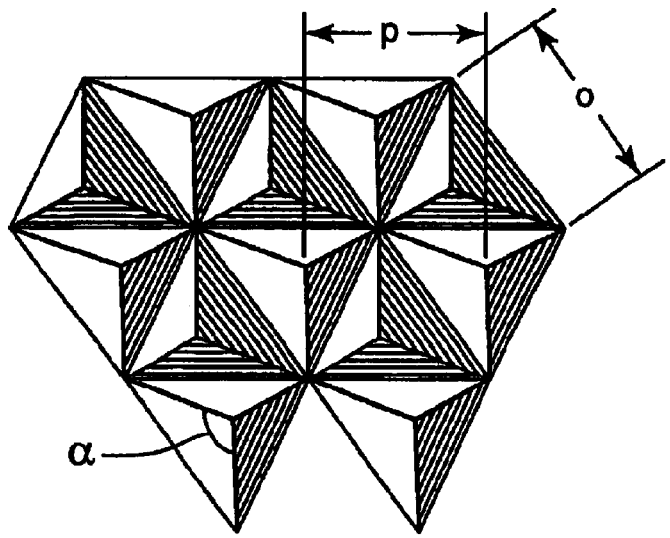
FIG. 8 is a plane view of an abrading surface of an abrasive pad for CMP as another example of the present invention.

FIG. 8 is a plane view of an abrading surface of an abrasive pad for CMP as another example of the present invention. In this example, the three-dimensional elements have a tetrahedral shape in which ridges are connected at a point on the top. In this case, the angle $\alpha$ formed between two ridges is typically 30 to 150°, preferably 45 to 140°. The three-dimensional elements may have a pyramidal shape. In this case, the angle formed between two ridges is typically 30 to 150°, preferably 45 to 140°. The height h of the three-dimensional elements is, for example, 2 to 300 μm, preferably 5 to 150 μm.

In FIG. 8, the symbol o represents the bottom side length of the three-dimensional element. The symbol p represents the distance between the tops of adjacent three-dimensional elements. The length o is, for example, 5 to 1000 μm, preferably 10 to 500 μm. The distance p is, for example, 5 to 1000 μm, preferably 10 to 500 μm.

Here, the three-dimensional elements may have a tetrahedral shape having a flat top surface by truncating the top to have a predetermined height. In this case, the height of the three-dimensional elements is 5 to 95%, preferably 10 to 90%, of the height of the three-dimensional elements before the truncation of the top.

Figure 9:
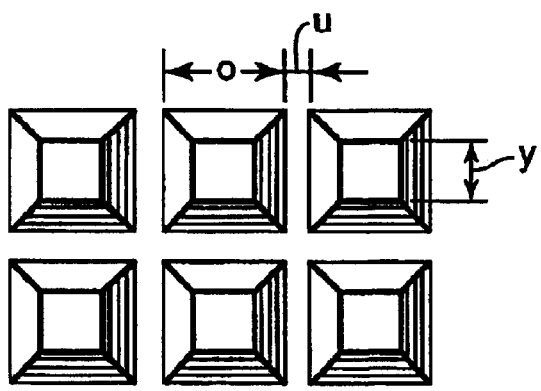
FIG. 9 is a plane view of an abrading surface of an abrasive pad for CMP as another example of the present invention.

FIG. 9 is a plane view of an abrading surface of an abrasive pad for CMP as another example of the present invention. In this example, the three-dimensional elements have a pyramidal shape having a flat top surface by truncating the top to have a predetermined height. The height of these three-dimensional elements is similar to that of the tetrahedral shape shown in FIG. 8.

In FIG. 9, the symbol o represents the bottom side length of the three-dimensional element. The symbol u represents a distance between bottom sides of adjacent three-dimensional elements. The symbol y represents the length of one side of the top surface. The length o is, for example, 5 to 2000 μm, preferably 10 to 1000 μm. The distance u is, for example, 0 to 1000 μm, preferably 2 to 500 μm. The length y is, for example, 0.5 to 1800 μm, preferably 1 to 900 μm.

Figure 10:
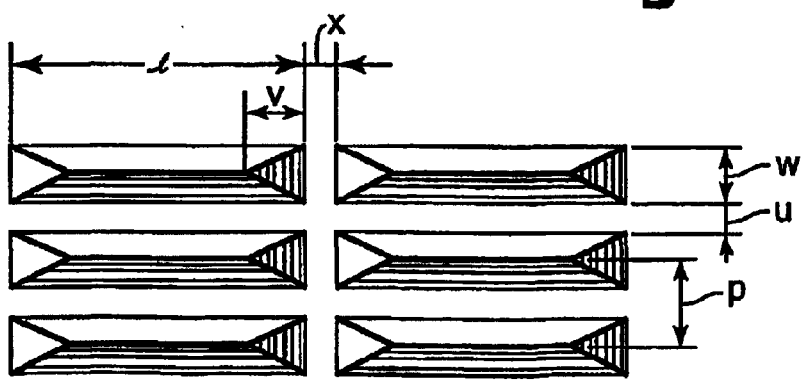
FIG. 10 is a plane view of an abrading surface of an abrasive pad for CMP as another example of the present invention.

FIG. 10 is a plane view of an abrading surface of an abrasive pad for CMP as another example of the present invention. In this example, the three-dimensional elements have a prismatic shape made of a laterally-positioned triangular prism, where the ends of the prismatic three-dimensional elements is cut at an acute angle from its bottom to form a house shape having four inclined surfaces. The apex angle of the triangle obtained by cutting a prism with a plane perpendicular to the longitudinal direction is typically 30 to 150°, preferably 45 to 140°. The height of the three-dimensional elements is, for example, 2 to 600 μm, preferably 4 to 300 μm.

Here, the length of the prismatic three-dimensional elements may extend substantially over an entire region of the abrasive pad. Alternatively, the length of the three-dimensional elements may be terminated to a suitable length, as shown in FIG. 10. The ends of the three-dimensional elements may be either aligned or non-aligned. Further, the top may be truncated to form a prismatic shape having a flat top surface. In this case, the height of the three-dimensional elements is 5 to 95%, preferably 10 to 90%, of the height of the three-dimensional elements before the truncation of the top.

In FIG. 10, the symbol 1 represents the length of a long bottom side of the three-dimensional element. The symbol v represents the distance of a portion of the three-dimensional element cut at an acute angle. The symbol x represents the distance between short bottom sides of adjacent three-dimensional elements. The symbol w represents the length of the short bottom side of the three-dimensional element (width of the three-dimensional element). The symbol p represents the distance between tops of adjacent three-dimensional elements. The symbol u represents the distance between long bottom sides of adjacent three-dimensional elements. The length 1 is, for example, 5 to 10000 μm, preferably 10 to 5000 μm. The distance v is, for example, 0 to 2000 μm, preferably 1 to 1000 μm. The distance x is, for example, 0 to 2000 μm, preferably 0 to 1000 μm. The length w is, for example, 2 to 2000 μm, preferably 4 to 1000 μm. The distance p is, for example, 2 to 4000 μm, preferably 4 to 2000 μm. The distance u is, for example, 0 to 2000 μm preferably 0 to 1000 μm.

The abrasive pad for CMP of the present invention is preferably produced by the method described below.

First, an abrasive material coating solution is prepared which contains abrasive grains and a binder. The abrasive material coating solution to be used herein is a composition containing the binder, the abrasive grains, and optionally additives such as a photoinitiator in sufficient amounts to constitute an abrasive composite and being capable of further containing a volatile solvent in a sufficient amount to impart fluidity to the mixture.

Next, a mold sheet is prepared which has a plurality of regularly arranged recesses. The shape of the recesses may be an inverse of the three-dimensional element to be formed. The mold sheet may be made of a metal such as nickel or plastics such as polypropylene. For example, a thermoplastic resin such as polypropylene is preferable because it can be embossed at its melting point on a metal tool to form recesses of a predetermined shape. Further, if the binder is a radiation-curing type resin, it is preferable to use a material that transmits ultraviolet rays and visible light.

The mold sheet is filled with the abrasive material coating solution. The filling step can be carried out by applying the abrasive material coating solution onto the mold sheet by means of a coating apparatus such as a roll coater.

A substrate is superposed on the mold sheet to allow the abrasive material coating solution to adhere to the substrate. The adhesion step is carried out, for example, by pressing with a roll for lamination.

The binder is hardened. The term "hardening" as used herein means that the binder is polymerized into a solid state. After the hardening, the specific shape of the abrasive layer does not change.

The binder is hardened by heat, infrared radiation, or by electron beam radiation, ultraviolet radiation, or by another radiation energy such as visible light radiation. The amount of radiation energy to be applied may vary depending on the type of the binder and the radiation energy source to be used. Usually, those skilled in the art can suitably determine the amount of radiation energy to be applied. The period of time required in hardening may vary depending on the thickness, density, temperature of the binder, the properties of the composition, and others.

For example, the binder may be hardened by radiating ultraviolet rays (UV) from above the transparent substrate.

The mold sheet is removed to produce an abrasive pad composed of the substrate and the abrasive layer having a three-dimensional structure. The binder may be hardened after the mold sheet is removed. The construction of the obtained abrasive pad may be changed by an ordinary method such as bonding it onto a flat hard supporter.

EXAMPLES

The present invention will be more specifically described by way of the following examples. However, the present invention is not limited by these examples. Unless particularly indicated, the "parts" in the Examples refer to parts by weight.

Example

An abrasive material coating solution was prepared by mixing the components shown in Table 1.

TABLE 1

| Components | Mixing amounts (parts) |
|---|---|
| Alumina abrasive grains produced by CVD ("Sumicorundum AA04" manufactured by Sumitomo Chemical Industry Co., Ltd., particle size: 0.4 µm) | 100.0 |
| Photopolymerizable acrylic monomer ("SR9003" available from US Sartoner Co., Ltd.) | 15.0 |
| Photopolymerizable acrylic monomer ("SR339" available from US Sartoner Co., Ltd.) | 22.6 |
| Dispersant ("Disperbyk-L11" manufactured by BYK-Chemie Co., Ltd.) | 0.6 |
| Photoinitiator ("Irgacure 819" manufactured by Ciba Specialty Chemicals Co., Ltd.) | 0.4 |

Mold sheets made of polypropylene and having recesses with a shape of inverted cylindrical three-dimensional elements shown in FIGS. 5 to 7 were prepared. The distance between adjacent three-dimensional elements was adjusted so that the ratio of the total contact area to the semiconductor wafer would be 18%. The dimensions are shown in Table 2.

TABLE 2

| Symbol | Dimension (µm) |
|---|---|
| d | 200 |
| e | 218 |
| f | 218 |
| h | 45 |

The abrasive material coating solution was applied onto the mold sheet made of polypropylene by means of a roll coater. A transparent PET film having a thickness of 100 µm was superposed thereon and pressed by a roll for lamination. Ultraviolet rays were radiated to harden the binder.

The mold sheet was removed and the resultant was cooled to room temperature to produce an abrasive pad. The abrasive layer of the abrasive pad has a three-dimensional structure shown in FIG. 5, and the dimension thereof is a tape shape with a width of 1.27 cm×length of 10 cm. The abrasive performance of the abrasive pad was tested.

Frictional Force

FIG. 11 is a model view showing a method of testing the frictional force of an abrasive pad. As an object to be abraded, a glass tube having a diameter of 10 mm was used. The glass tube 11, which is an object to be abraded, was mounted to the shaft of a motor (not illustrated). The abrasive pad 12 was hung on the glass tube 11 with its abrading surface facing inwards. One end was fixed to a distortion gauge 13, and a weight 14 of 200 g was attached to the other end.

The motor was started to rotate the glass tube in the direction shown by an arrow. The rotation speed was set to be 240 rpm. The frictional force (g) displayed in the distortion gauge 13 was read and diachronically recorded. The results are shown by a graph in FIG. 12.

The abrasive pad of the present invention had a low frictional force, and a tendency of rising frictional force did not appear with lapse of the time for abrasion, thereby exhibiting good frictional properties.

Finish of the Abraded Surface

The finish of the abraded surface of the glass tube abraded for four minutes by the above-mentioned method was measured by an optical microscope (Magnifying Power: 50 times).

The abraded surface abraded with the abrasive pad of the present invention was free from defects and scratches, and had a high degree of flatness.

Comparative Example

An abrasive pad was fabricated in the same manner as in Example 1 except that alumina produced by a conventional method ("TIZOX B109" manufactured by Transelco Co., Ltd. particle size: about 0.15 µm) was used instead of the alumina abrasive grains produced by CVD, and its abrasive performance was tested. The results are shown by a graph in FIG. 12.

The abrasive pad of Comparative Example had a high frictional force, and a tendency of rising frictional force appeared with lapse of the time for abrasion, thereby exhibiting poor friction properties. Moreover, the abraded surface abraded with the abrasive pad of Comparative Example had defects or scratches, and had a low degree of flatness.

As described and shown above, an abrasive pad for CMP having good friction properties and being inexpensive and excellent in durability without causing defects or scratches on the abraded surface of a semiconductor wafer, has been provided.

It is claimed:

1. An abrasive pad for CMP having a substrate and an abrasive layer disposed on the substrate, wherein said abrasive layer has a three-dimensional structure including a plurality of regularly arranged three-dimensional elements having a predetermined shape, and said abrasive layer comprises an abrasive composite containing advanced alumina abrasive grains produced by a CVD method and a binder as construction components.

2. An abrasive pad for CMP according to claim 1, wherein the shape of said three-dimensional elements is selected from the group consisting of cylindrical shape, conical shape, tetrahedral shape, pyramidal shape, tetrahedral or pyramidal shape having a flat top surface, prismatic shape, prismatic shape having a flat top surface, and striped shape.

3. An abrasive pad for CMP according to claim 1, wherein an average particle size of said advanced alumina abrasive grains is within a range from 0.01 to 20 µm.

4. An abrasive pad for CMP according to claim 1, wherein a concentration of the abrasive grains contained in the abrasive composite is within a range from 10 to 90 wt %.

5. An abrasive pad for CMP according to claim 1, wherein said binder is selected from the group consisting of phenolic resin, aminoplast resin, urethane resin, epoxy resin, acrylic resin, acrylated isocyanurate resin, urea-formaldehyde resin, isocyanurate resin, acrylated urethane resin, acrylated epoxy resin, glue, and a mixture thereof.

* * * * *